(12) United States Patent
Doesburg et al.

(10) Patent No.: US 7,955,708 B2
(45) Date of Patent: Jun. 7, 2011

(54) OPTIMIZED HIGH TEMPERATURE THERMAL BARRIER

(75) Inventors: Jacobus C. Doesburg, Edmonton (CA);
Liangde Xie, Pearl River, NY (US);
Richard Schmid, Gerlikon (CH);
Matthew Gold, Farmingdale, NY (US)

(73) Assignee: Sulzer Metco (US), Inc., Westbury, NY (US)

( * ) Notice: Subject to any disclaimer, the term of this patent is extended or adjusted under 35 U.S.C. 154(b) by 968 days.

(21) Appl. No.: 11/520,044

(22) Filed: Sep. 13, 2006

(65) Prior Publication Data
US 2011/0003119 A1    Jan. 6, 2011

Related U.S. Application Data

(60) Provisional application No. 60/724,268, filed on Oct. 7, 2005.

(51) Int. Cl.
*B32B 18/00* (2006.01)
*C04B 41/87* (2006.01)

(52) U.S. Cl. ........ 428/472; 428/469; 428/701; 428/632; 428/633; 428/640; 428/323; 428/698; 416/241 R; 416/241 B

(58) Field of Classification Search .................. None
See application file for complete search history.

(56) References Cited

U.S. PATENT DOCUMENTS
4,360,598 A    11/1982   Otagiri et al.
4,520,114 A    5/1985    David (Continued)

FOREIGN PATENT DOCUMENTS
EP           1126044 A1 *   8/2001
EP           1 889 949       2/2008
JP           011 797 25      7/1989
JP           2005-002409     6/2005
WO           WO 2008/096072  8/2008
WO           WO 2009/038785  3/2009

OTHER PUBLICATIONS

Goedjen, et.al. Proceedings of the 8th National Thermal Spray Conference, Sep. 11-15, 1995, Houston, TX, p. 73-77.*

(Continued)

*Primary Examiner* — Jennifer C McNeil
*Assistant Examiner* — Vera Katz
(74) *Attorney, Agent, or Firm* — Greenblum & Bernstein, P.L.C.

(57) ABSTRACT

The invention is directed to high purity zirconia-based and/or hafnia-based materials and coatings for high temperature cycling applications. Thermal barrier coatings made from the invention high purity material was found to have significantly improved sintering resistance relative to coatings made from current materials of lower purity. The invention materials are high purity zirconia and/or hafnia partially or fully stabilized by one or any combinations of the following stabilizers: yttria, ytterbia, scandia, lanthanide oxide and actinide oxide. Limits for impurity oxide, oxides other than the intended ingredients, that lead to significantly improved sintering resistance were discovered. High purity coating structures suitable for high temperature cycling applications and for application onto a substrate were provided. In one structure, the coating comprises a ceramic matrix, porosity and micro cracks. In another structure, the coating comprises a ceramic matrix, porosity, macro cracks and micro cracks. In another structure, the coating comprises ceramic columns and gaps between the columns. In another structure, the coating comprises ceramic columns, gaps between the columns and nodules distributing randomly in the gaps and columns.

24 Claims, 9 Drawing Sheets

U.S. PATENT DOCUMENTS

| | | | |
|---|---|---|---|
| 4,535,033 | A | 8/1985 | Stecura |
| 4,565,792 | A | 1/1986 | Knapp |
| 4,639,356 | A | 1/1987 | O'toole et al. |
| 4,788,045 | A | 11/1988 | Colombet et al. |
| 4,849,142 | A | 7/1989 | Panda et al. |
| 4,898,368 | A * | 2/1990 | Schaffer et al. ............... 266/222 |
| 4,936,745 | A | 6/1990 | Vine et al. |
| 5,015,502 | A | 5/1991 | Strangman et al. |
| 5,073,433 | A | 12/1991 | Taylor |
| 5,106,794 | A | 4/1992 | Oizumi et al. |
| 5,418,003 | A | 5/1995 | Bruce et al. |
| 5,705,231 | A | 1/1998 | Nissley et al. |
| 5,780,110 | A | 7/1998 | Schaeffer et al. |
| 5,780,171 | A | 7/1998 | Nissley et al. |
| 6,042,878 | A | 3/2000 | Bruce |
| 6,102,656 | A | 8/2000 | Nissley et al. |
| 6,123,997 | A | 9/2000 | Schaeffer et al. |
| 6,284,691 | B1 | 9/2001 | Bruce |
| 6,352,788 | B1 * | 3/2002 | Bruce ........................ 428/633 |
| 6,358,002 | B1 | 3/2002 | Good et al. |
| 6,812,176 | B1 | 11/2004 | Zhu et al. |
| 6,869,550 | B2 | 3/2005 | Dorfman et al. |
| 6,893,994 | B2 | 5/2005 | Wallar |
| 6,960,395 | B2 | 11/2005 | Spitsberg et al. |
| 7,001,859 | B2 | 2/2006 | Zhu et al. |
| 7,186,466 | B2 | 3/2007 | Zhu et al. |
| 7,723,249 | B2 | 5/2010 | Doesburg et al. |
| 7,776,459 | B2 | 8/2010 | Schlichting et al. |
| 7,846,561 | B2 | 12/2010 | Kulkarni |
| 2002/0094448 | A1 * | 7/2002 | Rigney et al. ................. 428/633 |
| 2004/0033884 | A1 * | 2/2004 | Wallar ........................ 501/103 |
| 2004/0229031 | A1 * | 11/2004 | Gell et al. .................... 428/323 |
| 2005/0170200 | A1 * | 8/2005 | Nagaraj et al. ............... 428/633 |
| 2005/0238894 | A1 | 10/2005 | Gorman et al. |
| 2006/0216534 | A1 | 9/2006 | Boutwell et al. |
| 2007/0082131 | A1 | 4/2007 | Doesburg et al. |
| 2007/0274837 | A1 | 11/2007 | Taylor et al. |
| 2008/0160172 | A1 | 7/2008 | Taylor et al. |
| 2008/0220209 | A1 | 9/2008 | Taylor et al. |
| 2009/0315227 | A1 | 12/2009 | Ferrier et al. |
| 2010/0075147 | A1 | 3/2010 | Doesburg et al. |
| 2010/0311562 | A1 | 12/2010 | Xie et al. |

OTHER PUBLICATIONS

Miller et al. Proceedings of the 7th National Spray Conference, Jun. 20-24, 1994, Boston, MS, p. 49-54.*

"Amperit Thermal Spray Powder Catalog," H.C. Starck GmbH, published 2005.

Online Catalog "Product Information Amperit 832 Catalog," H.C. Starck GmbH, found at http://www.hcstarck.com/medien/dokumente/document_Produktinfo832.pdf.

"Amperit Thermal Spray Powder Catalog," H.C. Starck, published 1995.

European Search Report date Feb. 14, 2007 for European Patent Application No. 06121639.6.

R. Vaβen, N. Czech, W. Malléner, W. Stamm, D. Stóver, "Influence of impurity content and porosity of plasma-sprayed yttria-stabilized zirconia layers on the sintering behaviour", pp. 135-140, Apr. 10, 2000, www.eisevier.nl/locate/surfcoat, Germany.

Robert A. Miller, "Thermal Barrier Coatings for Aircraft Engines—History and Directions", NASA Lewis Research Center Mar. 1995, pp. 17-27, Cleveland, OH.

Lou George, "Praxair Introduces New Yttria-Stabilized Zirconia Powder", p. 22, www.ptihome.com, Spraytime First Quarter 2003.

U.S. Appl. No. 11/520,041 (copy available by request).

U.S. Appl. No. 11/790,430 (copy available by request).

F. G. Sherif et al., Emulsion Precipitation of Yttria-Stabilized Zirconia for Plasma Spray Coatings, J. AM. Ceram. Soc., 74 (1991) p. 375-380.

* cited by examiner

OPTIMIZED HIGH TEMPERATURE THERMAL BARRIER

CROSS REFERENCE TO RELATED APPLICATIONS

This application claims priority under 35 U.S.C. §119(e) from U.S. Provisional Patent Application No. 60/724,268, filed on Oct. 7, 2005, which is incorporated herein by reference.

STATEMENT REGARDING FEDERALLY SPONSORED RESEARCH OR DEVELOPMENT

Not Applicable

REFERENCE TO A "MICROFICHE APPENDIX"

Not Applicable

BACKGROUND OF THE INVENTION

1. Field of the Invention

The invention relates to ceramic materials for thermal barriers coating systems in high temperature cycling applications, and more particularly to ultra-pure zirconia- and/or hafnia-based materials for use in thermal barrier coating applications.

2. Description of the Related Art

Gas turbine engines are widely used for aircraft propulsion and for ground based power generation. In order to increase efficiency, gas turbines are required to run hotter and faster. Therefore, there is a continued demand to increase firing temperatures in the combustion portions of gas turbines, which provides one of the greatest materials challenges. The development of superalloys has led to an increase in the hot-section operation temperature of gas turbine engines from approximately 760° C. to 1040° C. over the period 1940-1970. Since 1970, further improvement of gas-turbine engine performance has become increasingly difficult because conventional nickel- or cobalt-based superalloys have already reached their maximum temperature capabilities. Since NASA proposed to use a thin layer of insulating ceramic to help shield components from direct exposure to high temperatures on space vehicles and rocket engines in the late 1950s and early 1960s, extensive research and development on thermal barrier coatings (TBCs) has been performed and funded by government agencies, research institutions and industries.

Today, TBCs are widely used in gas turbines. In order to function as a thermal barrier, TBC materials must meet the following requirements: (1) low thermal conductivity; (2) high coefficient of thermal expansion; (3) high melting point; (4) high thermal shock resistance; and (5) be resistant to erosion, (6) compatibility with bond coat. When all these requirements are considered, 6~9 weight percent yttria stabilized zirconia (7YSZ) is the conventional material of choice. The thermal conductivity of 7YSZ TBCs deposited using air plasma spray can be as low as 0.8 W/(Km). However, the thermal conductivity can go up to 1.5~2.0 W/(Km) after high temperature exposure as a result of sintering, which significantly deteriorate the thermal insulation capability of TBCs. In addition, the elimination of microcracks and fine void due to sintering leads to the increase of coating stiffness, which has an adverse effect on coating durability. Accordingly, there is a quest to find new materials and to optimize coating structures so as to produce a TBC that has prolonged durability and can provide excellent thermal insulation over extended period of service time.

SUMMARY

Accordingly, the invention is directed to a high purity material for high temperature cycling applications. Coatings made from the invention high purity material have high sintering resistance to achieve prolonged service lifetime and high operating temperatures.

In zirconia- ($ZrO_2$) and/or hafnia- ($HfO_2$) based materials for TBCs, the limits for impurity oxides discovered to result in improved sintering resistance and therefore prolonged service lifetime compared with current YSZ materials with higher impurity concentrations are disclosed herein. Oxide impurities are defined as oxides other than the intended ingredients, such as but not limited to soda ($Na_2O$), silica ($SiO_2$) and alumina ($Al_2O_3$).

High purity coating structures suitable for high temperature cycling applications and for application onto a substrate were provided. In one structure, the coating included a ceramic matrix, porosity and micro cracks. In another structure, the coating included a ceramic matrix, porosity, macro cracks and micro cracks. In another structure, the coating comprises ceramic columns and gaps between the columns. In another structure, the coating comprises ceramic columns, gaps between the columns and nodules distributing randomly in the gaps and columns.

In one aspect, the invention provides a high-purity coating structure suitable for high temperature cycling applications formed by the process of providing in a form suitable for use in thermal spraying applications a material of about 4 to 20 weight percent of a stabilizer of one or more rare earth oxides, and a balance of at least one of zirconia ($ZrO_2$), hafnia ($HfO_2$) and combinations thereof, wherein the zirconia ($ZrO_2$) and/or hafnia ($HfO_2$) is partially stabilized by the stabilizer, and wherein the total amount of impurities is less than or equal to 0.15 weight percent. The material is then sprayed onto a metal substrate (or optional bond coat) using a thermal spray process at pressures between 1 Pa and 1 MPa, so as to form a stream of molten and/or semi-molten droplets that build up a coating of frozen lamellar splats subsequent to impact with the substrate.

Another aspect of the invention provides a high-purity coating structure that is suitable for high temperature cycling applications, said coating structure formed by the process of providing a material consisting essentially of about 4 to 20 weight percent of a stabilizer of one or more rare earth oxides, and a balance of at least one of zirconia ($ZrO_2$), hafnia ($HfO_2$) and combinations thereof, wherein the zirconia ($ZrO_2$) and/or hafnia ($HfO_2$) is partially stabilized by the stabilizer, and wherein the total amount of impurities is less than or equal to 0.15 weight percent. The material is then sprayed onto a metal substrate (or optional bond coat) using a vapor deposition process at pressures between 1 mPa and 1 kPa, so as to form a coating with ceramic columns and gaps between the columns.

In yet another aspect of the invention, an essentially-columnar high-purity coating structure that is suitable for high temperature cycling applications, said coating structure formed by the process of providing a material consisting essentially of about 4 to 20 weight percent of a stabilizer of one or more rare earth oxides, and a balance of at least one of zirconia ($ZrO_2$), hafnia ($HfO_2$) and combinations thereof, wherein the zirconia ($ZrO_2$) and/or hafnia ($HfO_2$) is partially stabilized by the stabilizer, and wherein the total amount of impurities is less than or equal to 0.15 weight percent. The material is then sprayed onto a metal substrate (or optional bond coat) using a low pressure plasma spray process at pressures between 1 Pa and 10 kPa, so as to form a coating having ceramic columns, gaps between the columns, and frozen droplets distributed randomly in the gaps and columns.

In a further aspect of the invention, a high-purity coating is provided. The coating includes about 4 to 20 weight percent of a stabilizer of one or more rare earth oxides and a balance of at least one of zirconia ($ZrO_2$), hafnia ($HfO_2$) and combinations thereof, wherein the zirconia ($ZrO_2$) and/or hafnia ($HfO_2$) is partially stabilized by the stabilizer, and wherein the total amount of impurities in the coating is less than or equal to 0.15 weight percent.

One other aspect of the invention provides a method for producing a high-purity coating structure suitable for high temperature cycling applications. The method includes providing a material consisting essentially of about 4 to 20 weight percent of a stabilizer of one or more rare earth oxides, and a balance of at least one of zirconia ($ZrO_2$), hafnia ($HfO_2$) and combinations thereof, wherein the zirconia ($ZrO_2$) and/or hafnia ($HfO_2$) is partially stabilized by the stabilizer, and wherein the total amount of impurities is less than or equal to 0.15 weight percent. The method also includes spraying said material onto a metal substrate using a thermal spray process.

Additional aspects and advantages of the invention will be set forth in the description which follows, and in part will be obvious from the description, or may be learned by practice of the invention. The aspects and advantages of the invention may be realized and obtained by means of the instrumentalities and combinations particularly pointed out hereinafter.

BRIEF DESCRIPTION OF THE DRAWINGS

The accompanying drawings are included to provide further understanding of the invention and are incorporated in and constitute a part of this specification. The accompanying drawings illustrate embodiments of the invention and together with the description serve to explain the principles of the invention. In the figures.

DETAILED DESCRIPTION OF THE INVENTION

Reference will now be made in detail to the preferred embodiments of the invention, examples of which are illustrated in the accompanying drawings.

Figure 1:
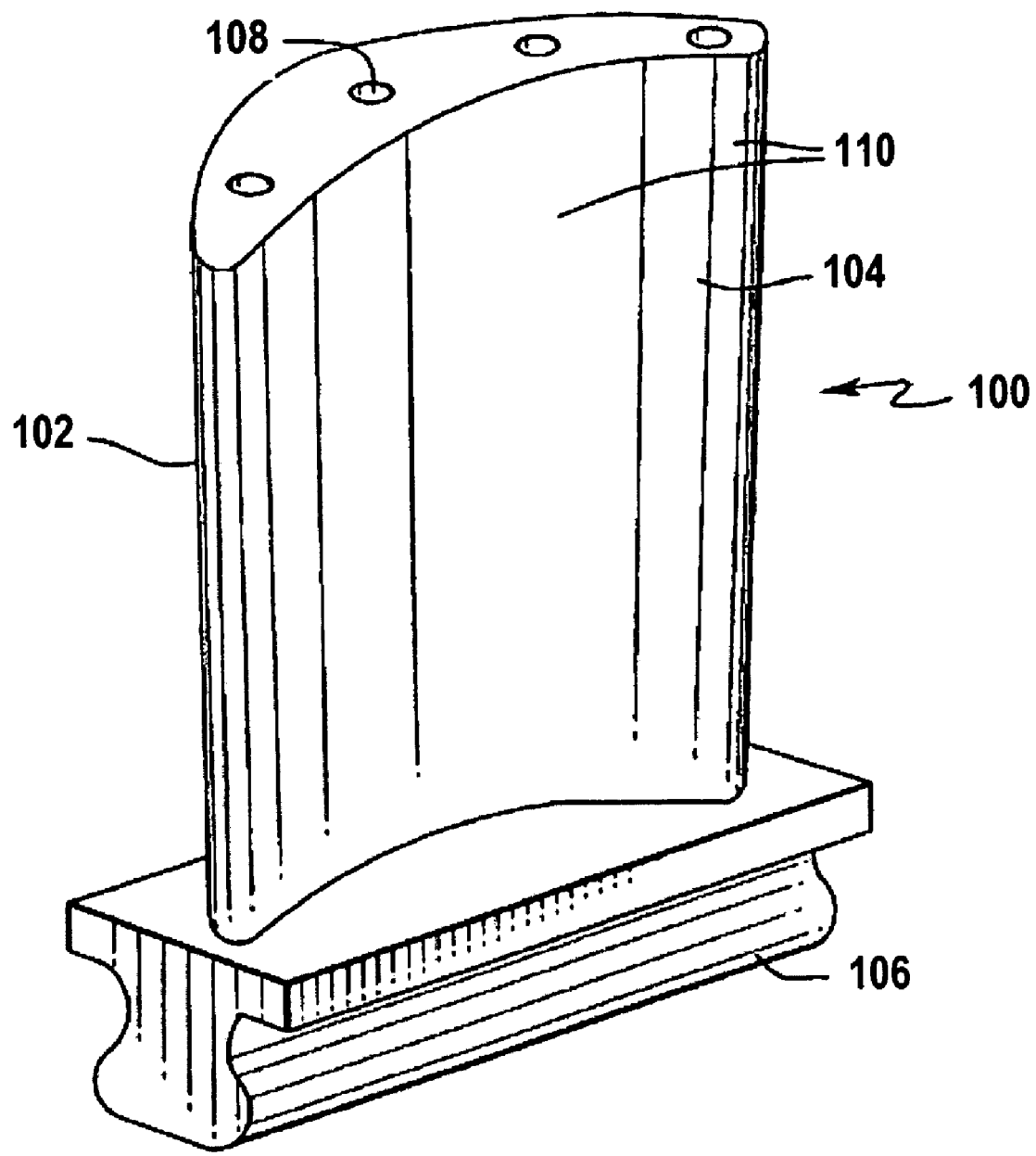
FIG. 1 illustrates a perspective view of a turbine blade coated with a thermal barrier of ceramic material.

In an exemplary use of a material of the invention, FIG. 1 shows one component of a turbine. Turbine blade (or substrate) 100 has a leading edge 102 and an airfoil section 104, against which hot combustion gases are directed during operation of the turbine, and which undergoes severe thermal stresses, oxidation and corrosion. A root end 106 of the blade anchors the blade 100. Venting passages 108 may be included through the blade 100 to allow cooling air to transfer heat from the blade 100. The blade 100 can be made from a high temperature resistant material. The surface of the blade 100 is coated with a thermal barrier coating 110 made of ultra-pure zirconia ($ZrO_2$) and/or hafnia ($HfO_2$) alloys in accordance with embodiments of the invention. The thermal barrier coating 110 may be applied on, for example, a MCrAlY bonding layer with an alumina scale (not shown) applied between the blade surface and the coating 110. The coating 110 may be applied onto the bond coating surface through a variety of methods known in the art including thermal spray techniques such as powder flame spray and plasma spray and vapor deposition methods such as electron beam physical vapor deposition (EBPVD), high speed physical vapor deposition and low pressure plasma spraying (LPPS).

When applied, the coating 110 contains porosities and cracks that offer the coating the required strain tolerance and thus allow it to survive numerous thermal cycles. In addition, the existence of porosities and cracks in the coating results in a reduction of thermal conductivity. However, some of these porosities and cracks will be eliminated when subject to service conditions due to sintering. As a result, thermal conductivity of the coating increases over time, which leads to the increase of bond coat and substrate temperatures. This and the resulting increase in coating stiffness accelerate the degradation of the TBC system.

The material of the invention is a high purity zirconia and/or hafnia based material. For purposes of the present invention, oxide impurities can be defined as oxides other than the intended ingredients, such as but not limited to soda ($Na_2O$), silica ($SiO_2$) and alumina ($Al_2O_3$). In accordance with the invention, the maximum limits for known impurities in order to decrease sintering rate and therefore increase service lifetime when used as a coating and stabilized with, for example, yttria, are about:

| | |
|---|---|
| soda ($Na_2O$) | 0.1 weight percent |
| silica ($SiO_2$) | 0.05 weight percent |
| alumina ($Al_2O_3$) | 0.01 weight percent |
| titania ($TiO_2$) | 0.05 weight percent |
| hematite ($Fe_2O_3$) | 0.05 weight percent |
| calcia (CaO) | 0.05 weight percent, and |
| magnesia (MgO) | 0.05 weight percent. |

In a preferred embodiment, the limits for known impurities are about:

| | |
|---|---|
| $Na_2O$ | 0.01 weight percent |
| $SiO_2$ | 0.01 weight percent |
| $Al_2O_3$ | 0.01 weight percent |
| $TiO_2$ | 0.01 weight percent |
| $Fe_2O_3$ | 0.01 weight percent |
| CaO | 0.025 weight percent, and |
| MgO | 0.025 weight percent. |

The impurity limits in the embodiments above are not indicative that any or all of the impurities listed will be included in the material in any amount. The embodiment of the invention may include zero weight percent of one or more of the above-listed impurities.

Figure 2:
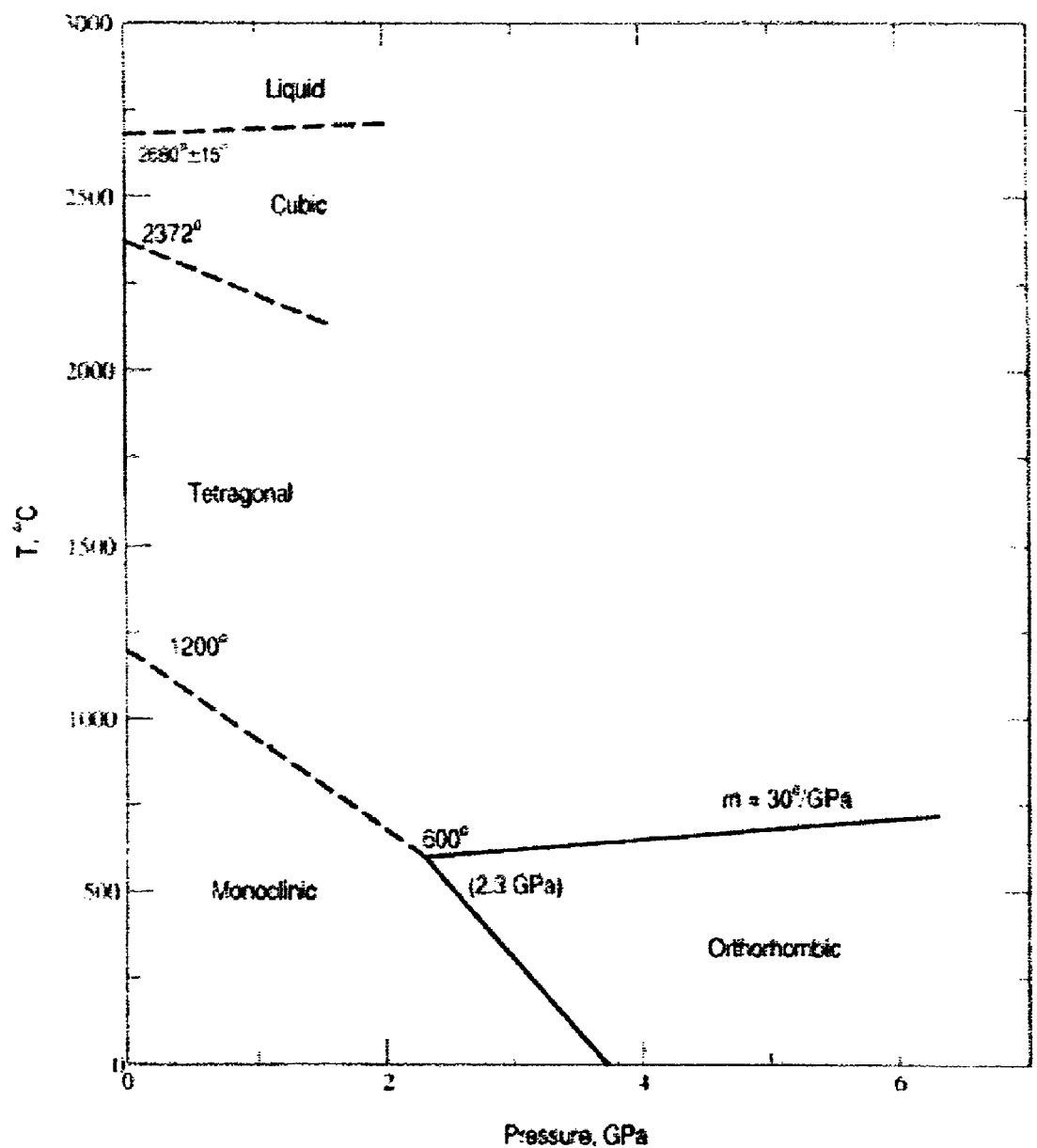
FIG. 2 provides a phase diagram for $ZrO_2$.

FIG. 2 provides a phase diagram for pure zirconia. (The diagram can be found, for example, in Ceramic Phase Diagram vol. 3, figure 04259.) As shown in FIG. 2, pure zirconia exists in three crystal phases at different temperatures. At very high temperatures (>2370° C.) the material has a cubic structure. At intermediate temperatures (1200 to 2372° C.) it has a tetragonal structure. At low temperatures (below 1200° C.) the material transforms to the monoclinic structure. The transformation from tetragonal to monoclinic is accompanied by a 3 to 5 percent volume increase that causes extensive stress in the material. Thus, pure zirconia cannot fulfill the coating requirements for high-temperature cyclic applications.

The high purity zirconia or hafnia based material of the present invention is a partially stabilized zirconia or hafnia solid solution. The stabilizer can be one or any combination of the following oxides: yttria ($Y_2O_3$), ytterbia ($Yb_2O_5$) scandia ($Sc_2O_3$), lanthanide oxide and actinide oxide. For purposes of the invention, these oxides (namely, any oxide from group IIIB (column 3) of the periodic table of elements) can be referred to as rare earth oxides. The concentration range of some stabilizer is about as follows:

$Y_2O_3$—4-12 weight percent
$Yb_2O_5$—4-16 weight percent
$Y_2O_3$ and $Yb_2O_5$—4-16 weight percent
$Y_2O_3$ and $Yb_2O_5$ and $Sc_2O_3$ or lanthanide oxide—4-16 weight percent In a preferred embodiment, the concentration ranges are about:

$Y_2O_3$—6-9 weight percent
$Yb_2O_5$—10-16 weight percent
$Y_2O_3$ and $Yb_2O_5$—4-16 weight percent
$Y_2O_3$ and $Yb_2O_5$ and $Sc_2O_3$ or lanthanide oxide—4-16 weight percent Other specific concentration ranges of stabilizers are provided in co-pending and commonly assigned U.S. patent application Ser. No. 11/520,043, entitled "CERAMIC MATERIAL FOR HIGH TEMPERATURE SERVICE," U.S. patent application Ser. No. 11/520,041, entitled "HIGH PURITY CERAMIC ABRADABLE COATINGS," and U.S. patent application Ser. No. 11/520,042, entitled "OPTIMIZED HIGH PURITY COATING FOR A HIGH TEMPERATURE THERMAL CYCLING APPLICATIONS" each filed on Sep. 13, 2006, and each incorporated herein by reference.

Figure 3:
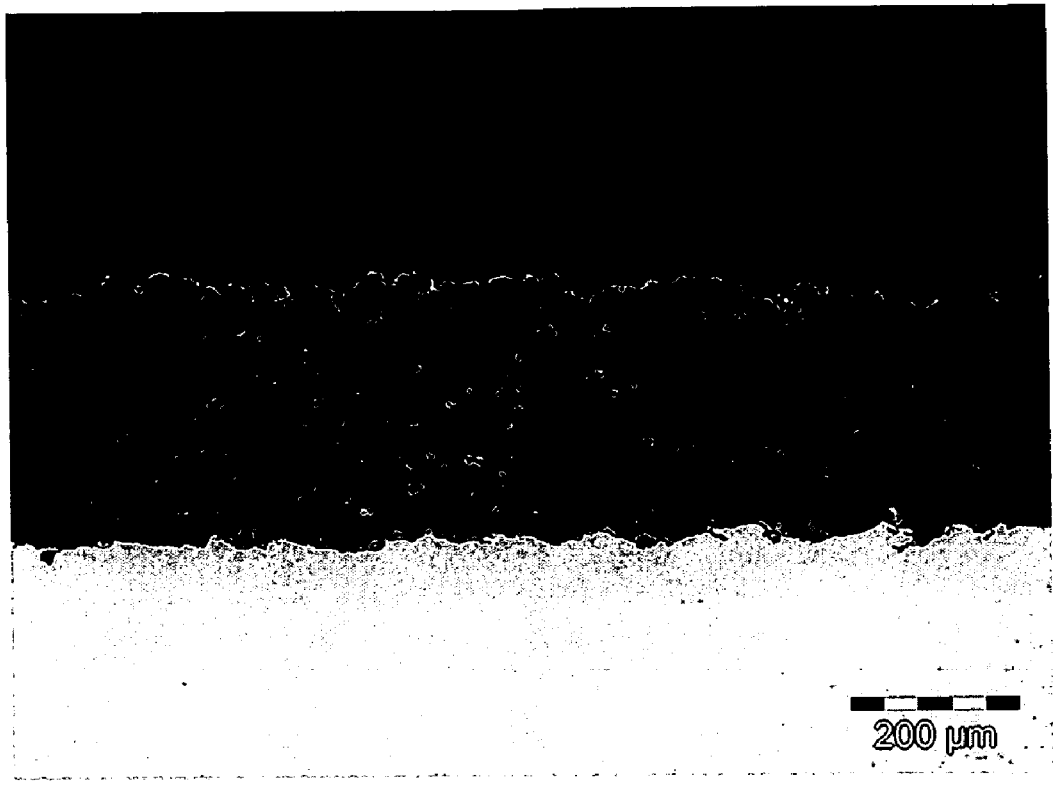
FIG. 3 provides a photomicrograph of a typical thermal barrier containing porosity and microcracks FIG. 4 provides a graph of in-plane sintering resistance of ceramic at 1400° C.
Figure 4:
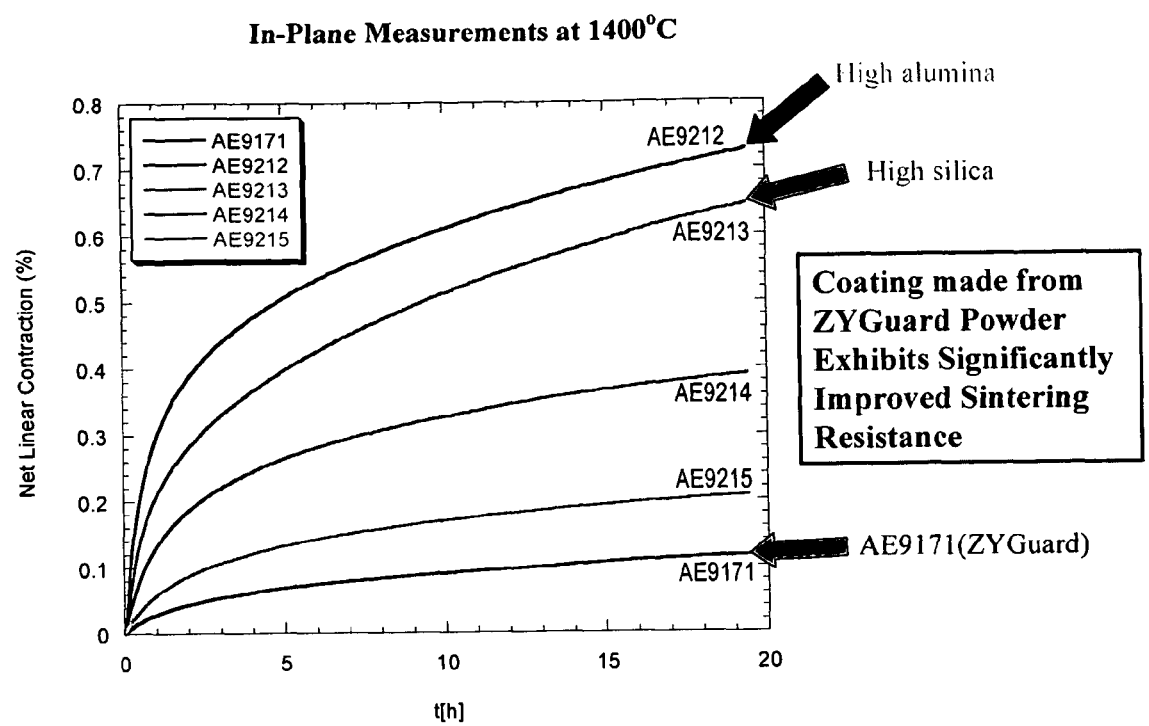

The material of present invention provides a significantly improved sintering resistance to thermal barrier coatings for high temperature cycling applications. As an example, high purity 7YSZ material was compared with currently used 7YSZ powders of lower purity. When materials containing various amounts of impurity oxides (see Table 1) were plasma sprayed to form coating of similar microstructure (see FIG. 3), it was found that the coating made from the invention material exhibits significantly improved sintering resistance. FIG. 4 shows the results of the dilatometry measurements on these coatings at 1400° C. Shrinkage of coating is a result of sintering. More shrinkage indicates a higher degree of sintering. As shown in FIG. 4, the shrinkage of the high purity coating (AE9171: 0.12% shrinkage) was reduced by more than 80 percent relative to that of low purity coatings (AE9212: 0.73% shrinkage and AE9213: 0.65% shrinkage).

TABLE 1

| Sample ID | ZrO2 | Y2O3 | Al2O3 | CaO | Fe2O3 | HfO2 | MgO | SiO2 | Th | TiO2 | U |
|---|---|---|---|---|---|---|---|---|---|---|---|
| AE9171 ZYGuard | Rem. | 7.57 | 0.05 | <0.01 | <0.01 | 1.89 | <0.01 | <0.01 | <0.002 | <0.01 | <0.002 |
| AE9212 | Rem. | 7.79 | 0.2 | 0.01 | 0.01 | 1.84 | <0.01 | 0.09 | 0.012 | 0.08 | 0.016 |
| AE9213 | Rem. | 7.78 | 0.09 | 0.02 | 0.02 | 1.76 | <0.01 | 0.18 | 0.01 | 0.04 | 0.018 |
| AE9214 | Rem. | 7.57 | 0.08 | 0.01 | 0.02 | 1.8 | <0.01 | 0.07 | 0.006 | 0.02 | 0.009 |
| AE9215 | Rem. | 7.41 | 0.07 | <0.01 | <0.01 | 1.62 | <0.01 | 0.02 | <0.002 | 0.08 | <0.002 |

Figure 5:
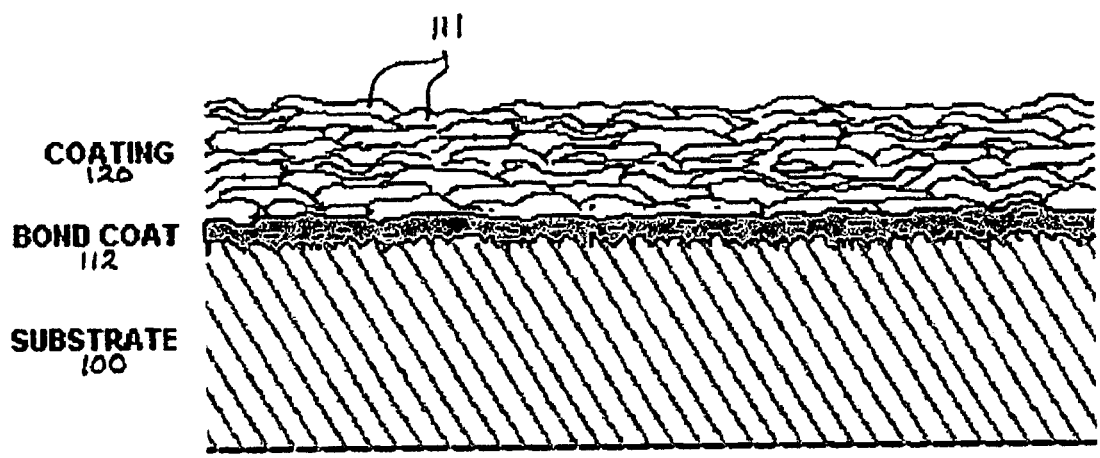
FIG. 5 provides a diagram showing a lamellar thermal barrier coating structure containing porosity and microcracks FIG. 6 provides a diagram showing a thermal barrier coating containing porosity, microcracks and macrocracks FIG. 7 provides a diagram showing a thermal barrier coating deposited from the vapor phase.

As mentioned earlier, porosities and cracks provide strain tolerance to TBCs and help to reduce thermal conductivities. Using thermal spray process, such as air plasma spray, flame spray or low pressure plasma spray, a high purity coating structure 120 (shown in FIG. 5) that comprise a ceramic matrix, porosity and microcracks can be achieved. The high purity coating structure is formed by injecting particles of invention high purity materials into a high temperature and high velocity flame. These particles are then heated and accelerated in the flame. Before reaching the substrate, some particles are molten, while some other particles are semi-molten or not melted. Referring to FIG. 5, molten and semi-molten particles strike on the substrate 100 (or optional bond coat 112) and then spread and solidify rapidly to form disk-like deposits 111, which are referred to as splats. Although some unmelted particles are entrapped and incorporated into the coating, most of them bounce off when they hit the substrate. The accumulation of splats and small amount of unmelted particles results in the coating formation. Due to shrinkage occurred during rapid solidification and imperfect packing of splats and unmelted particles, voids and cracks are generated in the coating. Herein, porosity refers to a void with an aspect ratio (length divided by width) of less than about 10. Typical porosity is in the range of about 5~20 volume percent, preferably in the range of about 7~15 volume percent. Micro cracks refers to a void with an aspect ratio (length divided by width) of larger than about 10 and the length of the void is less than about 100 micrometers. Typical volume percentage of micro cracks is in the range of about 2~15 volume percent, preferably in the range of about 5~10 volume percent.

Figure 6:
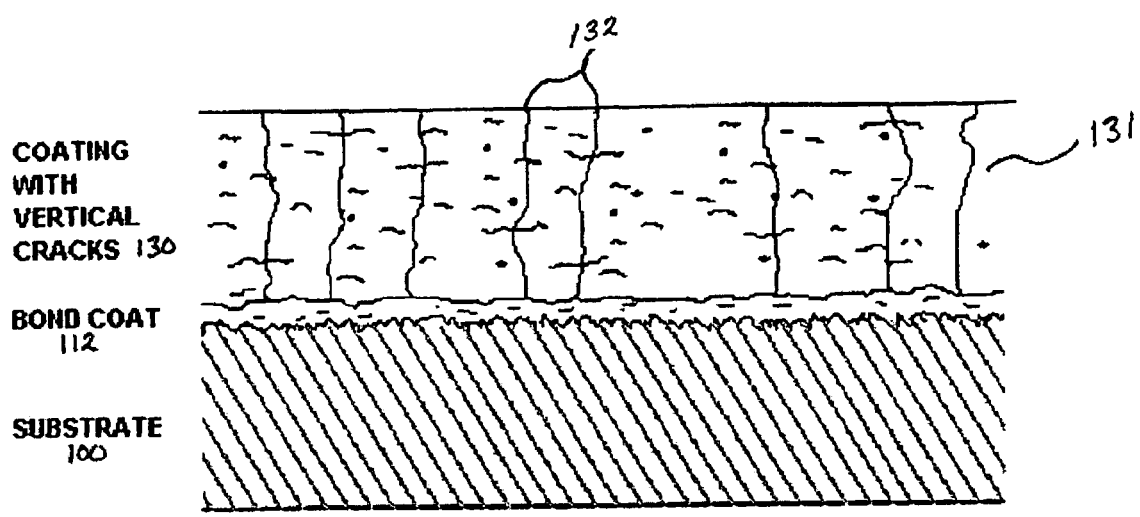

In order to enhance the strain tolerance of the aforementioned high purity TBCs, macro cracks that runs normal to the top coat and substrate interface can be introduced into the coating. As a result, another high purity coating structure that comprise a ceramic matrix, porosity, macro cracks and micro cracks (FIG. 6) can be achieved by thermal spray processes, such as air plasma spray, flame spray or low pressure plasma spray. The high purity coating structure 130 of FIG. 6 is formed by injecting particles of inventive materials into a high temperature and high velocity flame. These particles are then heated and accelerated in the flame. Before reaching the substrate, some particles are molten, while some other particles are semi-molten or not melted. Molten and semi-molten particles strike on the substrate 100 (or optional bond coat 112) and then spread and solidify rapidly to form disk-like deposits, which is referred to as splats. Although some unmelted particles are entrapped and incorporated into the coating, most of them bounce off when they hit the substrate. The accumulation of splats 131 and small amount of unmelted particles results in the coating formation 130. Due to shrinkage occurred during rapid solidification and imperfect packing of splats and unmelted particles, voids and cracks are generated in the coating. When coating deposition conditions are controlled to generate large shrinkage stress and improve the packing of splats to reduce voids and gaps between splats, cracks 132 normal to the coating 130 and substrate 100 interface are created. Herein, macro cracks refers to a void with an aspect ratio (length divided by width) of larger than about 10 and the length of the void is longer than about 100 micrometers. More than about 90% of the macro cracks are arranged in the direction normal to the top coat and substrate interface. These macro cracks are referred to as vertical macro cracks, while the macro cracks parallel to the top coat and substrate interface are referred to as horizontal vertical cracks. For this coating structure, typical volume percentage of porosity and micro cracks is less than about 10% and 5%, preferably less than about 5% and 3%, respectively. The average number of vertical macro cracks in a length of 25.4 mm along the top coat and substrate interface is in the range of about 5 to 250, preferably in the range of about 50 to 150.

Figure 7:
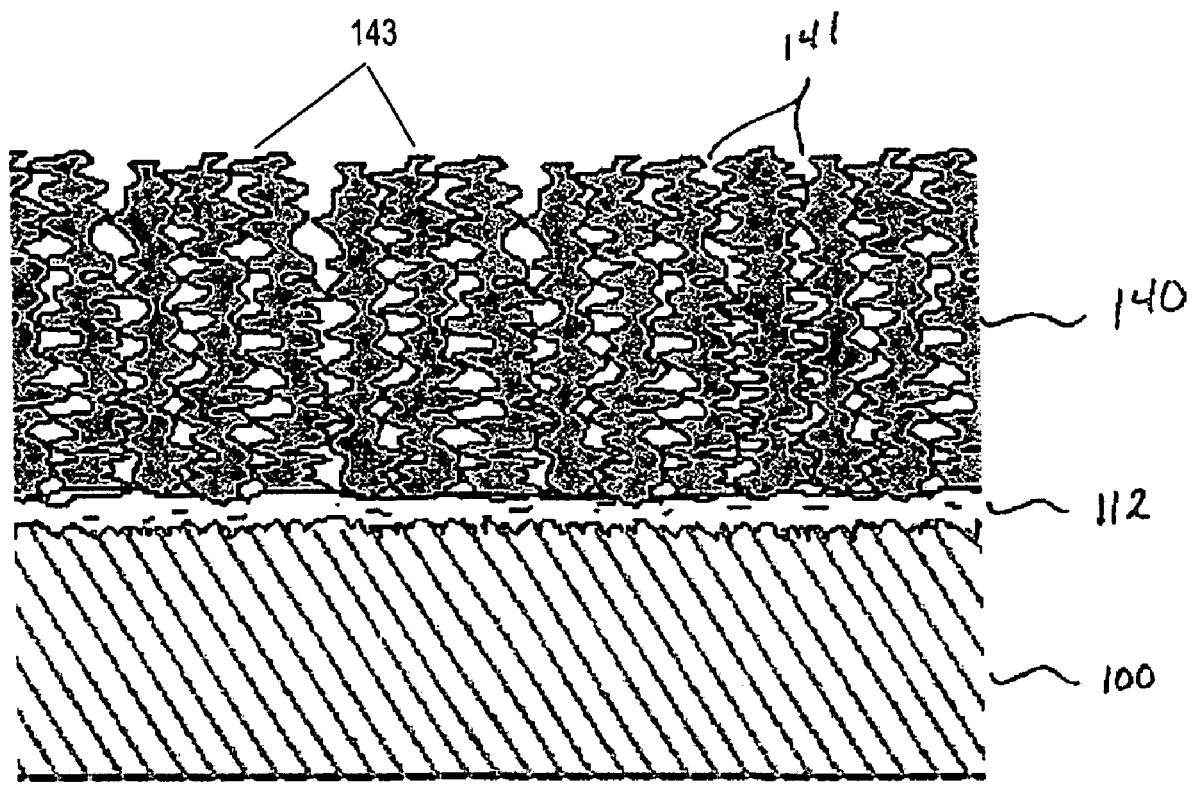
Figure 8:
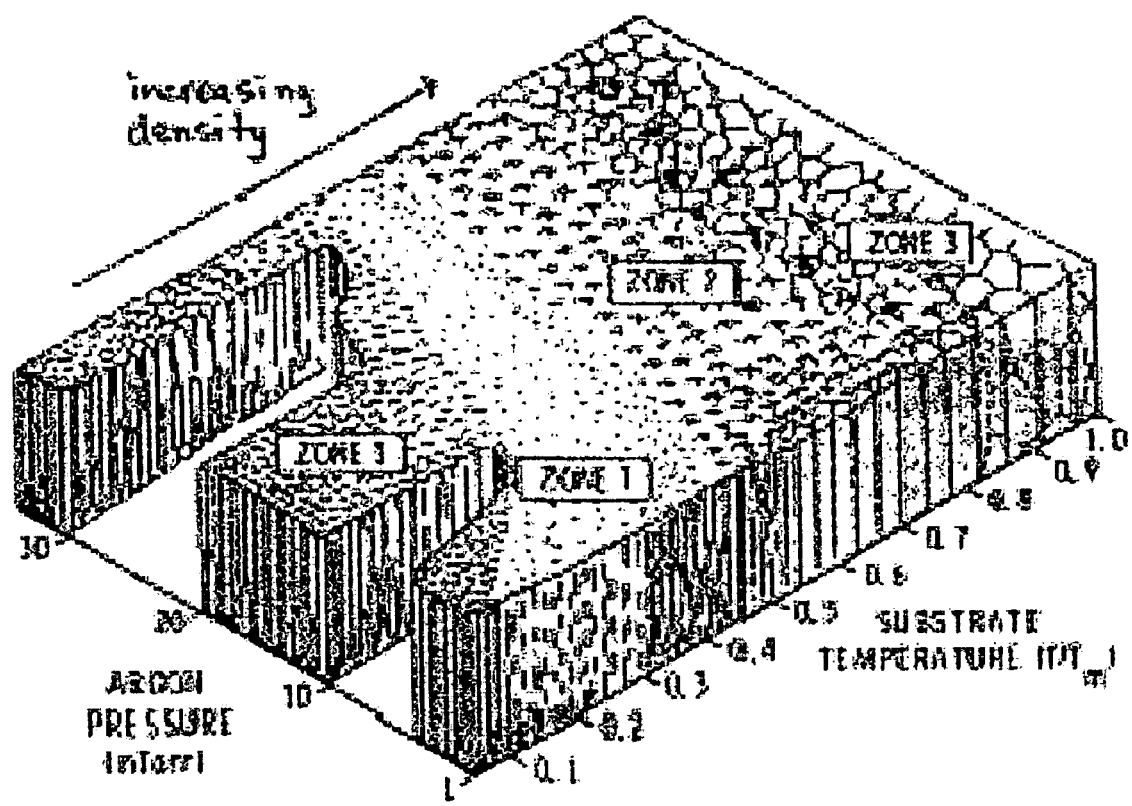
FIG. 8 provides a diagram showing the Thornton model for predicting structure of a coating formed from the gas phase.

When coatings are produced using a vapor deposition process, such as electron beam assisted physical vapor deposition process (EB-PVD) or low pressure (lower than ambient) plasma spraying, the resulting coating has a unique columnar structure. The gaps between columns impart excellent strain tolerance to the coating. Accordingly, TBCs produce using vapor deposition process, such as EB-PVD or low pressure (lower than ambient) plasma spraying, usually have a higher durability than TBCs produced using thermal spray processes. As illustrated in FIG. 7, if vapor deposition process was employed, another high purity coating structure 140 that comprises ceramic columns 143 and gaps 141 between them can be achieved. An optional bond coat 112 is shown between the substrate 100 and the coating 140. The high purity coating structure 140 is formed by vaporizing the inventive high purity materials in a form of powder, ingot, target, solution or suspension. The formed vapor then deposited atomically on the substrate. By controlling processing temperature and pressure according to the Thornton's model (FIG. 8), a coating with columnar structure is formed. Herein, ceramic columns 143 are basically a cluster of crystals. More than about 90% of the crystals are at an angle of about 45 to 135 degree to the top coat and substrate interface. Within the cluster of crystals, voids smaller than about 20 micrometers are present. The gaps 141 between the columns have an aspect ratio (length divided by width) of larger than about 10. More than about 90% of the gaps are at an angle of about 45 to 135 degree to the top coat and substrate interface.

Figure 9:
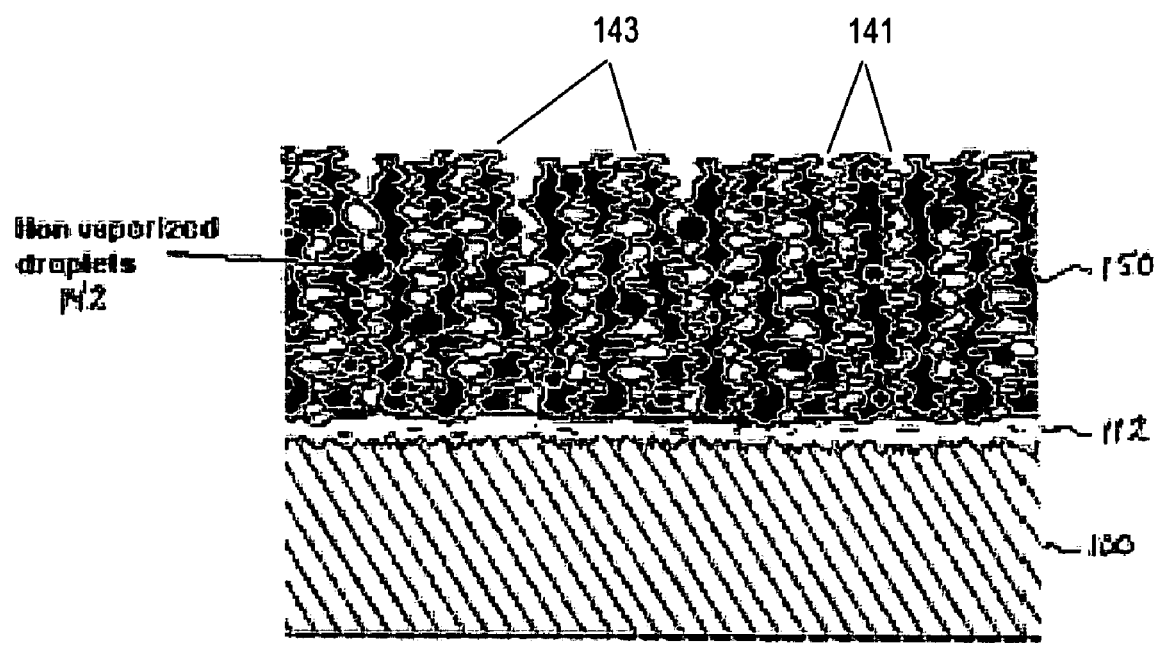
FIG. 9 provides a diagram showing a thermal barrier coating deposited from both vapor and liquid phase.

In low pressure (lower than ambient) plasma spraying process, if molten droplets are also generated during the vaporization of the invention high purity materials, then the entrapment and incorporation of these droplets into the coating results in the formation of another high purity coating structure. As illustrated in FIG. 9, the high purity coating structure 150 comprises ceramic columns 143, gaps between the columns 141, and nodules 142 distributing randomly in the gaps and columns. An optional bond coat 112 is shown between the substrate 100 and the coating 150. Herein, ceramic columns 143 are basically a cluster of crystals. More than 90% of the crystals are oriented at an angle of 45 to 135 degree to the top coat and substrate interface. Within the cluster of crystals 143, voids smaller than 20 micrometers are present. The gaps 141 between the columns have an aspect ratio (length divided by width) of larger than about 10. More than 90% of the gaps 141 are oriented at an angle of 45 to 135 degree to the top coat and substrate interface. The nodules 142 distributing randomly in the gaps and columns are frozen droplets. The size of these nodules 142 is typically less than about 45 micrometers, preferably less than about 30 micrometers.

While exemplary embodiments of the invention have been shown and described herein, it will be obvious to those skilled in the art that such embodiments are provided by way of example only. Numerous insubstantial variations, changes, and substitutions will now be apparent to those skilled in the art without departing from the scope of the invention disclosed herein by the Applicants. Accordingly, it is intended that the invention be limited only by the spirit and scope of the claims, as they will be allowed.

The invention claimed is:

1. A high-purity coating structure that is suitable for high temperature cycling applications, said coating structure formed by the process of:
    providing a material consisting essentially of about 4 to 20 weight percent of a stabilizer of one or more rare earth oxides, and a balance of at least one of zirconia ($ZrO_2$), hafnia ($HfO_2$) and combinations thereof, wherein the zirconia ($ZrO_2$) and/or hafnia ($HfO_2$) is partially stabilized by the stabilizer, and wherein the total amount of impurities is less than or equal to 0.15 weight percent; and
    spraying said material onto a metal substrate using a vapor deposition process at pressures between 1 mPa and 1 kPa, so as to form a coating with ceramic columns and gaps between the columns,
    wherein the sprayed high-purity coating structure comprises the ceramic columns and gaps between the columns, and
    wherein the amount of impurities is less than or equal to:
        about 0.01 weight percent silica,
        about 0.01 weight percent titania,
        about 0.01 weight percent hematite,
        about 0.025 weight percent calcic, and
        about 0.025 weight percent magnesia.

2. The coating structure of claim 1, wherein said vapor deposition process is one of low pressure spraying or electron beam physical vapor deposition.

3. The coating structure of claim 1, wherein said ceramic columns comprise a cluster of crystals and wherein about 90% or more of the crystals are oriented at an angle of about 45 to 135 degrees relative to an interface between the coating and the substrate.

4. The coating structure of claim 1, wherein said gaps between the columns have an aspect ratio greater than about 10 and wherein more than about 90% of the gaps are oriented at an angle of about 45 to 135 degrees relative to an interface between the coating and the substrate.

5. A high-purity coating applied to a substrate, said coating comprising:
    about 4 to 20 weight percent of a stabilizer of one or more rare earth oxides; and
    a balance of at least one of zirconia ($ZrO_2$), hafnia ($HfO_2$) and combinations thereof, wherein the zirconia ($ZrO_2$) and/or hafnia ($HfO_2$) is partially stabilized by the stabilizer, and wherein the total amount of impurities is less than or equal to 0.15 weight percent,
    wherein the high-purity coating comprises ceramic columns and gaps between the columns, and
    wherein the amount of impurities of less than or equal to:
        about 0.1 weight percent soda ($Na_2O$),
        about 0.05 weight percent silica ($SiO_2$), and
        about 0.01 weight percent alumina ($Al_2O_3$).

6. The coating of claim 5, wherein the coating structure has a ceramic matrix, porosity and micro-cracks.

7. The coating of claim 6, wherein said porosity has an aspect ratio of less than 10.

8. The coating of claim 7, wherein the porosity is in the range of about 2-20 volume percent.

9. The coating of claim 5, wherein said micro-cracks comprise a void having an aspect ratio of larger than about 10 and a length of less than about 100 micrometers.

10. The coating of claim 5, wherein the coating structure has a ceramic matrix, porosity, micro-cracks and macro-cracks.

11. The coating of claim 10, wherein said porosity has an aspect ratio of less than 10.

12. The coating of claim 11, wherein the porosity is less than about 12 volume percent.

13. The coating of claim 5, wherein the amount of impurities of is less than or equal to:
   about 0.05 weight percent titania ($TiO_2$),
   about 0.05 weight percent hematite ($Fe_2O_3$),
   about 0.05 weight percent calcia (CaO), and
   about 0.05 weight percent magnesia (MgO).

14. The coating of claim 5, wherein the amount of impurities is less than or equal to:
   about 0.01 weight percent silica,
   about 0.01 weight percent titania,
   about 0.01 weight percent hematite,
   about 0.025 weight percent calcia, and
   about 0.025 weight percent magnesia.

15. A high-purity coating structure that is suitable for high temperature cycling applications, said coating structure comprising:
   a material consisting essentially of about 4 to 20 weight percent of a stabilizer of one or more rare earth oxides, and a balance of at least one of zirconia ($ZrO_2$), hafnia ($HfO_2$) and combinations thereof, wherein the zirconia ($ZrO_2$) and/or hafnia ($HfO_2$) is partially stabilized by the stabilizer, and wherein the total amount of impurities is less than or equal to 0.15 weight percent; and
   said material being sprayable onto a metal substrate using a vapor deposition process at pressures between 1 mPa and 1 kPa, so as to form a coating with ceramic columns and gaps between the columns,
   wherein the high-purity coating structure comprises the ceramic columns and gaps between the columns, and
   wherein the amount of impurities is less than or equal to:
      about 0.1 weight percent soda ($Na_2O$),
      about 0.05 weight percent silica ($SiO_2$),
      about 0.01 weight percent alumina ($Al_2O_3$),
      about 0.05 weight percent titania ($TiO_2$)
      about 0.05 weight percent hematite ($Fe_2O_3$),
      about 0.05 weight percent calcia (CaO), and
      about 0.05 weight percent magnesia (MgO).

16. The coating structure of claim 15, wherein said ceramic columns comprise a cluster of crystals and wherein about 90% or more of the crystals are oriented at an angle of about 45 to 135 degrees relative to an interface between the coating and the substrate.

17. The coating structure of claim 15, wherein said gaps between the columns have an aspect ratio greater than about 10 and wherein more than about 90% of the gaps are oriented at an angle of about 45 to 135 degrees relative to an interface between the coating and the substrate.

18. The coating structure of claim 15, wherein the coating structure has a ceramic matrix, porosity and micro-cracks.

19. The coating structure of claim 18, wherein said porosity has an aspect ratio of less than 10.

20. The coating structure of claim 19, wherein the porosity is in the range of about 2-20 volume percent.

21. The coating structure of claim 18, wherein said micro-cracks comprise a void having an aspect ratio of larger than about 10 and a length of less than about 100 micrometers.

22. The coating structure of claim 15, wherein the coating structure has a ceramic matrix, porosity, micro-cracks and macro-cracks.

23. The coating structure of claim 22, wherein said porosity has an aspect ratio of less than 10.

24. The coating structure of claim 23, wherein the porosity is less than about 12 volume percent.

* * * * *